(12) United States Patent
Lopatin

(10) Patent No.: US 6,646,353 B1
(45) Date of Patent: Nov. 11, 2003

(54) SEMICONDUCTOR DEVICE HAVING REDUCED ELECTROMIGRATION IN COPPER LINES WITH CALCIUM-DOPED COPPER SURFACES FORMED BY USING A CHEMICAL SOLUTION

(75) Inventor: Sergey Lopatin, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/280,634

(22) Filed: Oct. 24, 2002

Related U.S. Application Data

(62) Division of application No. 09/728,684, filed on Nov. 30, 2000, now Pat. No. 6,509,262.

(51) Int. Cl.$^7$ ............................................. H01L 23/52
(52) U.S. Cl. .................... 257/774; 257/750; 257/762
(58) Field of Search ............................. 257/741, 762, 257/750, 773, 774

(56) References Cited

U.S. PATENT DOCUMENTS

| | | | | |
|---|---|---|---|---|
| 5,143,867 A | * | 9/1992 | d'Heurle et al. | 438/660 |
| 6,090,710 A | * | 7/2000 | Andricacos et al. | 438/687 |
| 6,358,848 B1 | * | 3/2002 | Lopatin | 438/687 |
| 6,387,806 B1 | * | 5/2002 | Wang et al. | 438/687 |
| 6,423,433 B1 | * | 7/2002 | Lopatin et al. | 428/702 |
| 6,444,580 B1 | * | 9/2002 | Lopatin et al. | 438/687 |
| 6,469,387 B1 | * | 10/2002 | Lopatin et al. | 257/750 |
| 6,486,560 B1 | * | 11/2002 | Lopatin | 257/762 |
| 6,509,262 B1 | * | 1/2003 | Lopatin | 438/658 |
| 6,521,532 B1 | * | 2/2003 | Cunningham | 438/687 |
| 6,551,872 B1 | * | 4/2003 | Cunningham | 438/225 |

OTHER PUBLICATIONS

Peter Van Zant, Microchip Fabrication: A Practical Guide to Semiconductor Processing, (1997), 392 and 397, 3$^{rd}$ Edition, McGraw–Hill USA.

* cited by examiner

*Primary Examiner*—Nathan J. Flynn
*Assistant Examiner*—Pershelle Greene
(74) *Attorney, Agent, or Firm*—LaRiviere, Grubman & Payne, LLP

(57) ABSTRACT

A method of fabricating a semiconductor device having copper (Cu) interconnect lines, formed in vias, whose surfaces are selectively doped with calcium (Ca) ions for preventing electromigration and a device thereby formed. The present invention method reduces electromigration in Cu interconnect lines by restricting Cu diffusion pathways along the interconnect surface. This diffusion restriction is achieved by selectively doping the Cu interconnect surfaces with Ca ions from a chemical solution. The present invention also provides a method of fabricating a semiconductor device, having a contaminant-reduced Cu-Ca/Cu interconnect line structure for reducing electromigration, improving interconnect reliability, and preventing corrosion, the method comprising: (a) providing a semiconductor substrate; (b) depositing a Cu interconnect line on the semiconductor substrate; (c) treating the Cu interconnect line in a chemical solution for facilitating selective doping of the Cu interconnect line with copper and calcium, thereby selectively forming a Cu-Ca-X film on the Cu interconnect line, wherein X denotes at least one contaminant; (d) processing the Cu-Ca-X film by sputtering under an argon (Ar) atmosphere, thereby removing the at least one contaminant, and thereby effecting a thin Cu-Ca film on the Cu interconnect line; (e) annealing the thin Cu-Ca film, whereby the thin Cu-Ca film is alloyed, thereby forming a contaminant-reduced Cu-Ca alloy surface on the Cu interconnect line, and thereby forming a contaminant-reduced Cu-Ca/Cu interconnect line structure, comprising the contaminant-reduced Cu-Ca alloy surface, on the semiconductor substrate; and (f) completing formation of the semiconductor device.

10 Claims, 2 Drawing Sheets

SEMICONDUCTOR DEVICE HAVING REDUCED ELECTROMIGRATION IN COPPER LINES WITH CALCIUM-DOPED COPPER SURFACES FORMED BY USING A CHEMICAL SOLUTION

CROSS-REFERENCE TO RELATED APPLICATION(S)

This application is related to the following commonly assigned applications: (1) U.S. Ser. No. 09/728,313, entitled "Chemical Solution for Cu-Ca-O Thin Film Formations on Cu Surfaces;"(2) U.S. Ser. No. 09/728,315, entitled "Method of Forming Cu-Ca-O Thin Films on Cu Surfaces in a Chemical Solution and Semiconductor Device thereby Formed;"(3) U.S. Ser. No. 09/728,314, entitled "Method of Calcium Doping a Cu -Surface Using a Chemical Solution and Semiconductor Device thereby Formed;"(4) U.S. Ser. No. 09/728,312, entitled "Method of Reducing Carbon, Sulphur, and Oxygen Impurities in a Calcium-Doped Cu Surface and Semiconductor Device thereby Formed;"(5) U.S. Ser. No. 09/728,685, entitled "Method of Reducing Electromigration in Copper Lines by Forming an Interim Layer of Calcium-Doped Copper Seed Layer in a Chemical Solution and Semiconductor Device thereby Formed;" and is a division of (6) U.S. Ser. No. 09/728,684, entitled "Method of Reducing Electromigration in Copper Lines by Calcium-Doping Copper Surfaces in a Chemical Solution and Semiconductor Device thereby Formed;" and therefrom claims priority.

TECHNICAL FIELD

The present invention relates to semiconductor devices and their methods of fabrication. More particularly, the present invention relates to the processing of copper interconnect material and the resultant device utilizing the same. Even more particularly, the present invention relates to reducing electromigration in copper interconnect lines by doping their surfaces with barrier material using wet chemical methods.

BACKGROUND OF THE INVENTION

Currently, the semiconductor industry is demanding faster and denser devices (e.g., 0.05-$\mu$m to 0.25-$\mu$m) which implies an ongoing need for low resistance metallization. Such need has sparked research into resistance reduction through the use of barrier metals, stacks, and refractor metals. Despite aluminum's (Al) adequate resistance, other Al properties render it less desirable as a candidate for these higher density devices, especially with respect to its deposition into plug regions having a high aspect ratio cross-sectional area. Thus, research into the use of copper as an interconnect material has been revisited, copper being advantageous as a superior electrical conductor, providing better wettability, providing adequate electromigration resistance, and permitting lower depositional temperatures. The copper (Cu) interconnect material may be deposited by chemical vapor deposition (CVD), plasma enhanced chemical vapor deposition (PECVD), sputtering, electroless plating, and electrolytic plating.

However, some disadvantages of using Cu as an interconnect material include etching problems, corrosion, and diffusion into silicon.[1] These problems have sparked further research into the formulation of barrier materials for preventing electromigration in both Al and Cu interconnect lines. In response to electromigration concerns relating to the fabrication of semiconductor devices having aluminum-copper alloy interconnect lines, the industry has been investigating the use of various barrier materials. For instance, titanium-tungsten (Ti-W) and titanium nitride (TiN) layers have been used as well as refractory metals such as titanium (Ti), tungsten (W), tantalum (Ta), and molybdenum (Mo) and their silicates.[2] Although the foregoing materials are adequate for Al interconnects and Al—Cu alloy interconnects, they have not been entirely effective with respect to all-Cu interconnects. Further, although CVD has been conventionally used for depositing other metal(s) on an interconnect surface, CVD is not a cost-effective method of doping Cu interconnect surfaces with Ca ions. Therefore, a need exists for providing a method of fabricating a semiconductor device having Cu interconnect lines whose surfaces are doped with Ca ions for preventing electromigration and a device thereby formed.

BRIEF SUMMARY OF THE INVENTION

Accordingly, the present invention provides a method of fabricating a semiconductor device having Cu interconnect lines, formed in vias of a semiconductor substrate, whose surfaces are selectively doped with calcium (Ca) ions for preventing electromigration and a device thereby formed. The present invention method reduces electromigration in Cu interconnect lines by restricting Cu diffusion pathways along the interconnect surface. This diffusion restriction is achieved by selectively doping the Cu interconnect surfaces with Ca ions from a chemical solution. More specifically, the present invention provides a method of fabricating a semiconductor device having a contaminant-reduced Cu—Ca/Cu interconnect line structure for reducing electromigration, improving interconnect reliability, and preventing corrosion, the method comprising: (a) providing a semiconductor substrate; (b) depositing a Cu interconnect line on the semiconductor substrate; (c) treating the Cu interconnect line in a chemical solution for facilitating selective doping of the Cu interconnect line with copper and calcium, thereby selectively forming a Cu—Ca—X film on the Cu interconnect line, wherein X denotes at least one contaminant; (d) processing the Cu—Ca—X film by sputtering under an argon (Ar) atmosphere, thereby effecting a thin Cu—Ca film on the Cu interconnect line; (e) annealing the thin Cu—Ca film, whereby the thin Cu—Ca film is alloyed, thereby forming a contaminant-reduced Cu—Ca alloy surface on the Cu interconnect line, and thereby forming a contaminant-reduced Cu—Ca/Cu interconnect line structure, comprising the contaminant-reduced Cu—Ca alloy surface, on the semiconductor substrate; and (f) completing formation of the semiconductor device. The annealing step primarily removes O and secondarily removes C and S, especially when performed in an environment such as a vacuum, an inert gas, or a reducing ambient such as an ammonia ($NH_3$) plasma. Thus, the resultant device comprises a distinctive contaminant-reduced Cu surfaces selectively doped with calcium (Ca) on Cu interconnect lines formed in the vias of the substrate.

BRIEF DESCRIPTION OF THE DRAWING

For a better understanding of the present invention, reference is made to the below-referenced accompanying Drawing. Reference numbers refer to the same or equivalent parts of the present invention throughout the several figures of the Drawing.

DETAILED DESCRIPTION OF THE INVENTION

Figure 1:
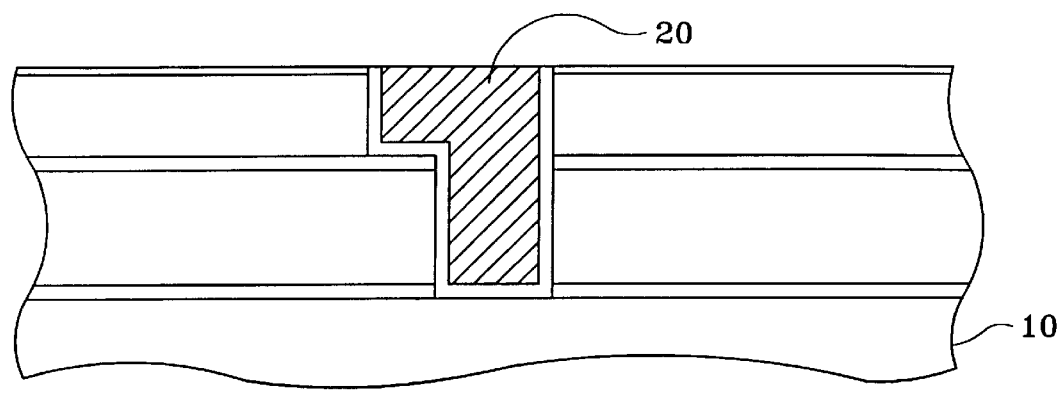
FIG. 1 is a cross-sectional view of a semiconductor substrate having formed thereon a dual inlaid Cu interconnect line, in accordance with the present invention.

FIG. 1 is a cross-sectional view of a semiconductor substrate 10 having formed thereon a dual inlaid Cu interconnect line 20 in a via, in accordance with the present invention.

Figure 2:
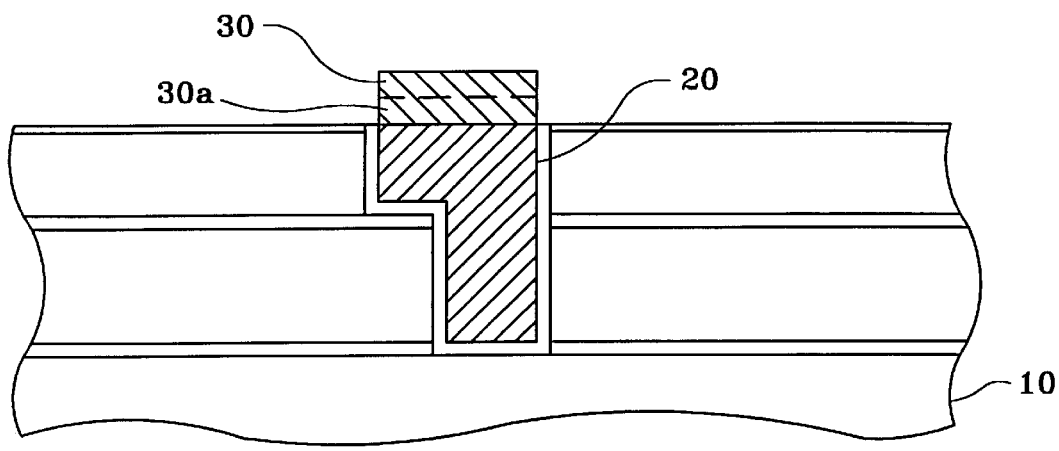
FIG. 2 is a cross-sectional view of the semiconductor substrate having formed thereon the dual inlaid Cu interconnect line, the dual inlaid Cu interconnect line having selectively formed thereon a Cu—Ca—X film via treatment in a chemical solution, as shown in FIG. 1, the Cu—Ca film being further treated, thereby decreasing its thickness to form a thin Cu—Ca film, in accordance with the present invention.

FIG. 2 is a cross-sectional view of the semiconductor substrate 10 having formed thereon the dual inlaid Cu interconnect line 20 in a via, the dual inlaid Cu interconnect line structure 20 having selectively formed thereon a Cu—Ca—X film 30, where X=a contaminant such as C, S, and O, via treatment in a chemical solution, as shown in FIG. 1, the Cu—Ca film 30 being further treated, thereby decreasing its thickness to form a thin Cu—Ca film 30a, in accordance with the present invention.

Figure 3:
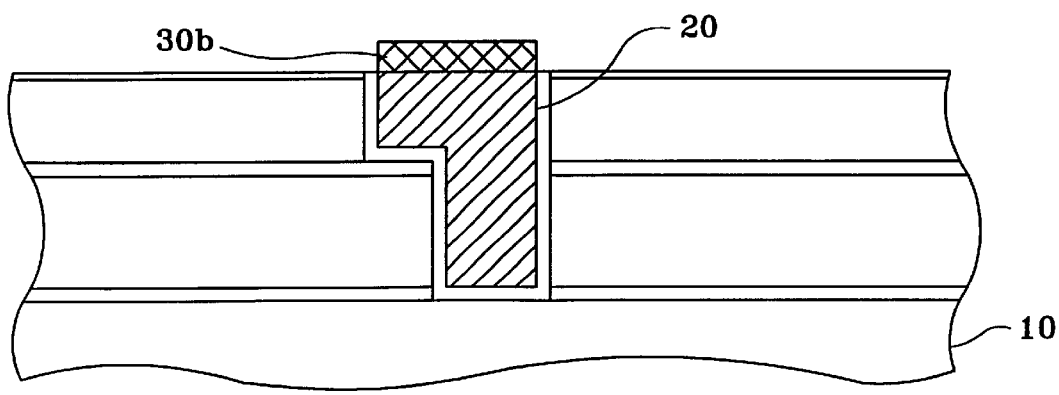
FIG. 3 is a cross-sectional view of the semiconductor substrate having formed thereon the dual inlaid Cu interconnect line structure, the dual inlaid Cu interconnect line having selectively formed thereon the Cu—Ca—X film via treatment in the chemical solution, the Cu—Ca—X film being further processed by sputtering under an Ar atmosphere for removing contaminants such as C, S, and O, effecting the thin Cu—Ca film on the dual inlaid Cu interconnect line, as shown in FIG. 2, the Cu—Ca film being annealed in a range of 250° C. to 450° C., under vacuum, onto the dual inlaid Cu interconnect line, forming a contaminant-reduced Cu—Ca alloy surface on the dual inlaid Cu interconnect line, thereby forming a contaminant-reduced Ca—Cu/Cu interconnect line structure, comprising the contaminant-reduced Cu—Ca alloy surface, for reducing electromigration therein, in accordance with the present invention.

FIG. 3 is a cross-sectional view of the semiconductor substrate having formed thereon the dual inlaid Cu interconnect line structure 20 in a via, the dual inlaid Cu interconnect line 20 having selectively formed thereon the Cu—Ca—X film 30 via treatment in the chemical solution, the Cu—Ca—X film 30 being further processed by sputtering under an Ar atmosphere for removing contaminants such as C, S, and O, effecting the thin Cu—Ca film 30a on the dual inlaid Cu interconnect line 20, as shown in FIG. 2, the Cu—Ca film 30a being annealed in a range of 250° C. to 450° C., under vacuum, an inert gas, or an ammonia ($NH_3$) plasma, onto the dual inlaid Cu interconnect line 20, forming a contaminant-reduced Cu—Ca alloy surface 30b on the dual inlaid Cu interconnect line 20, thereby forming a contaminant-reduced Ca—Cu/Cu interconnect line structure 100, comprising the contaminant-reduced Cu—Ca alloy surface 30b, for reducing electromigration therein, in accordance with the present invention.

Figure 4:
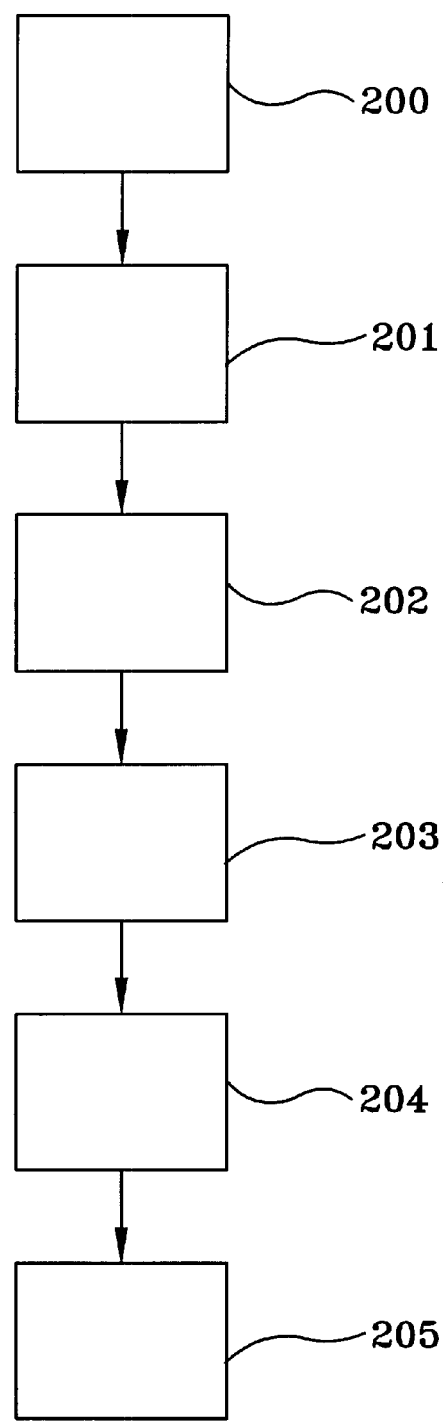
FIG. 4 is a flowchart of a method for fabricating a semiconductor device having a contaminant-reduced Ca—Cu/Cu interconnect line structure for reducing electromigration therein, in accordance with the present invention.

FIG. 4 is a flowchart of a method M for fabricating a semiconductor device having a contaminant-reduced Ca—Cu/Cu interconnect line structure 100 formed in a via for reducing electromigration therein, in accordance with the present invention. The method M comprises the steps of: providing a semiconductor substrate 10, as indicated by block 200; depositing a dual inlaid Cu interconnect line 20 in a via on a semiconductor substrate 10 by a method such as electroplating, electroless plating, PVD, or CVD, as indicated by block 201; treating the dual inlaid Cu interconnect line 20 in a chemical solution, thereby depositing a Cu—Ca—X film 30 onto the dual inlaid Cu interconnect line 20, as indicated by block 202; processing the Cu—Ca—X film 30 by sputtering under an Ar atmosphere, thereby removing at least one contaminant selected from a group consisting essentially of C, S, and O from the Cu—Ca—X film 30, and thereby effecting a thin Cu—Ca film 30a on the dual inlaid Cu interconnect line 20, as indicated by block 203; annealing the thin Cu—Ca film 30a, in a range of 250° C. to 450° C., under vacuum, whereby the Cu and the Ca metals are alloyed together, thereby forming a contaminant-reduced Cu—Ca alloy surface 30b on the dual inlaid Cu interconnect line 20, and thereby forming a contaminant-reduced Ca—Cu/Cu interconnect line structure 100, comprising the contaminant-reduced Cu—Ca alloy surface 30b, as indicated by block 205; and completing formation of the semiconductor device, as indicated by block 205, in accordance with the present invention. Further, the chemical solution may comprise an electroless plating solution, which in turn, may comprise Cu salts, Ca salts, complexing agents, reducing agents, pH adjusters, and surfactants. The Cu—Ca alloy surface is Cu-rich and may have a Ca-doping level in a range of 0.2 atomic % to 5 atomic %.

Alternatively, a device having a greater tolerance of impurities may also be formed (e.g., more impurity-tolerant applications): (1) where high levels of C and S impurities are tolerable in the Cu—Ca—X film, neither the Ar-sputtering step nor the annealing step need be performed; (2) where low levels of C and S impurities are tolerable in the Cu—Ca—X film, the annealing step need be performed; (3) where high levels of C, S, and O impurities are tolerable in the Cu—Ca film, the Ar-sputtering step need not be performed; however, (4) where low to zero levels of C, S, and O impurities are tolerable in the Cu—Ca film, the full process (i.e., method M) must be performed.

Information as herein shown and described in detail is fully capable of attaining the above-described object of the invention, the presently preferred embodiment of the invention, and is, thus, representative of the subject matter which is broadly contemplated by the present invention. The scope of the present invention fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims. Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, or method step is explicitly recited in the claims. However, it should be readily apparent to those of ordinary skill in the art that various changes and modifications in form, semiconductor material, and fabrication material detail may be made without departing from the spirit and scope of the inventions as set forth in the appended claims. No claim herein is to be construed under the provisions of 35 U.S.C. § 112, sixth paragraph, unless the element is expressly recited using the phrase "means for."

What is claimed:

1. A semiconductor device, having a contaminant-reduced copper-calcium alloy on copper (Cu—Ca/Cu) interconnect structure in a via for reducing electromigration therein, comprising:
   a. a semiconductor substrate having the via;
   b. a copper (Cu) interconnect line deposited in the via; and
   c. a copper-calcium (Cu—Ca) alloy surface deposited on the Cu interconnect line,
      the Cu interconnect line being treated in an electroless plating solution for facilitating selective doping of the Cu interconnect line with copper (Cu) and calcium (Ca), thereby selectively forming a Cu—Ca—X film on the Cu interconnect line, wherein X denotes at least one contaminant,
      the Cu—Ca—X film being processed by sputtering under an argon (Ar) atmosphere, thereby removing the at least one contaminant, and thereby effecting a thin Cu—Ca film on the Cu interconnect line,
      the thin Cu—Ca film being annealed,
      the thin Cu—Ca film being alloyed,
         thereby forming a contaminant-reduced Cu—Ca alloy surface on the Cu interconnect line, and
         thereby forming the. contaminant-reduced Cu—Ca/Cu interconnect structure, comprising the contaminant-reduced Cu—Ca alloy surface, on the semiconductor device.

2. A device, as recited in claim 1,
   wherein the Cu interconnect line is deposited by a technique selected from a group consisting essentially of electroplating, electroless plating, chemical vapor deposition (CVD), plasma vapor deposition (PVD), and plasma enhanced chemical vapor deposition (PECVD), and
   wherein the Cu interconnect line is dual inlaid.

3. A device, as recited in claim 1,
   wherein the chemical solution comprises an electroless plating solution, and
   wherein the electroless plating solution comprises:
      a. at least one solvent;
      b. at least one Cu salt;
      c. at least one Ca salt;
      d. at least one complexing agent; and
      e. at least one reducing agent, (b) through (e) being dissolved in (a).

4. A device, as recited in claim 3, wherein the electroless plating solution further comprises:
   f. at least one pH adjuster; and
   g. at least one surfactant, (f) and (g) being dissolved in (a).

5. A device, as recited in claim 1, wherein the at least one contaminant is selected from a group consisting essentially of carbon (C), sulphur (S), and oxygen (O).

6. A device, as recited in claim 1, wherein the Cu—Ca alloy surface is Cu-rich with a Ca-doping level in a range of 0.2 atomic % to 5 atomic %.

7. A device, as recited in claim 2, wherein the Cu—Ca alloy surface is Cu-rich with a Ca-doping level in a range of 0.2 atomic % to 5 atomic %.

8. A device, as recited in claim 3, wherein the Cu—Ca alloy surface is Cu-rich with a Ca-doping level in a range of 0.2 atomic % to 5 atomic %.

9. A device, as recited in claim 4, wherein the Cu—Ca alloy surface is Cu-rich with a Ca-doping level in a range of 0.2 atomic % to 5 atomic %.

10. A semiconductor device, having a contaminant-reduced copper-calcium alloy on copper (Cu—Ca/Cu) interconnect structure formed in a via for reducing electromigration therein, as recited in claim 1,
   wherein the Cu interconnect line is deposited in the via on the semiconductor substrate by a technique selected from a group consisting essentially of electroplating, electroless plating, chemical vapor deposition (CVD), plasma vapor deposition (PVD), and plasma enhanced chemical vapor deposition (PECVD),
   wherein the copper (Cu) interconnect line is dual inlaid,
   wherein the dual inlaid Cu interconnect line is treated in an electroless plating solution for facilitating selective doping of the dual inlaid Cu interconnect line with copper (Cu) and calcium (Ca), the solution comprising:
      (1) at least one solvent;
      (2) at least one Cu salt,
      (3) at least one calcium (Ca) salt,
      (4) at least one complexing agent,
      (5) at least one reducing agent,
      (6) at least one pH adjuster; and
      (7) at least one surfactant,
      (2) through (7) being dissolved in (1),
      thereby selectively forming a Cu—Ca—X film on the dual inlaid Cu interconnect line, wherein X denotes at least one contaminant selected from a group consisting essentially of C, S, and O,
   wherein the Cu—Ca—X film is processed by sputtering under an argon (Ar) atmosphere, thereby removing at least one contaminant from the Cu—Ca—X film, and thereby effecting a thin Cu—Ca film on the dual inlaid Cu interconnect line,
   wherein the thin Cu—Ca film is annealed in a temperature range of 250° C. to 450° C. in an environment selected from a group consisting essentially of a vacuum, an inert gas, and a reducing ambient, whereby the thin Cu—Ca film is alloyed, thereby forming a contaminant-reduced Cu—Ca alloy surface on the dual inlaid Cu interconnect line, the contaminant-reduced Cu—Ca alloy surface being Cu-rich and having a Ca-doping level in a range of 0.2 atomic % to 5 atomic %, and
      thereby forming a contaminant-reduced Cu—Ca/Cu interconnect structure, comprising contaminant-reduced Cu—Ca alloy surface, on the semiconductor device.

* * * * *